United States Patent [19]

Lewis

[11] Patent Number: 5,146,185

[45] Date of Patent: Sep. 8, 1992

[54] COMPACT OPTICALLY PUMPED RESONANCE SYSTEM AND APPARATUS

[75] Inventor: Lindon L. Lewis, Boulder, Colo.

[73] Assignee: Ball Corporation, Muncie, Ind.

[21] Appl. No.: 715,252

[22] Filed: Jun. 14, 1991

[51] Int. Cl.$^5$ .............................................. H03L 7/26
[52] U.S. Cl. ...................................... 331/3; 331/94.1; 372/2
[58] Field of Search ...................... 372/32; 331/3, 94.1

[56] References Cited

U.S. PATENT DOCUMENTS

| | | | |
|---|---|---|---|
| 4,146,848 | 3/1979 | Hellwig et al. | 331/3 |
| 4,315,224 | 2/1982 | Szekiel et al. | 331/3 |
| 4,323,860 | 8/1982 | Leiby, Jr. et al. | 372/32 |
| 4,684,900 | 8/1987 | Avila et al. | 331/94.1 |

Primary Examiner—Léon Scott, Jr.
Attorney, Agent, or Firm—Gilbert E. Alberding

[57] ABSTRACT

A compact frequency standard having a dielectrically loaded microwave resonant cavity. One embodiment uses light from a single laser at the frequency that causes $F=4 \rightarrow F'=5$ transitions in cesium, circularly polarizes a portion of the light to optically pump a cesium beam and uses another linearly polarized portion of the light to detect fluorescence after the beam passes through the microwave cavity. The microwave cavity is preferably dielectrically loaded cavity which is resonant in the $TE_{011}$ or $TE_{013}$ modes. The dielectric within the microwave cavity is in the form of a hollow cylinder with varying sidewalls displacing the effective axis of the microwave cavity from the geometric axis to produce a Ramsey resonance in a single cavity and creating inhomogeneities in the static field that cause narrow resonance anomalies in the cesium spectrum, which resonances may be locked onto to provide improved frequency standards.

35 Claims, 4 Drawing Sheets

COMPACT OPTICALLY PUMPED RESONANCE SYSTEM AND APPARATUS

FIELD OF THE INVENTION

The present invention relates generally to atomic microwave spectroscopy, and to methods and apparatus using optical fluorescence detection systems and, more particularly, to compact, optically pumped frequency standards employing dielectrically loaded resonance cavities with improved freedom from short-term and long-term instabilities and frequency variations due to changes in the environment of the standard, embodiments of which use the $F=4 \rightarrow 5$ transition for optical pumping, a $TE_{011}$ resonator as a Ramsey cavity, and anomalously narrow resonance features.

BACKGROUND ART

Atomic frequency standards generate and maintain a standard frequency output by using the transition between two well-defined energy levels of an atom and the associated constant frequency to control the frequency of a frequency generating means. The atomic transition between two energy levels is employed as a highly stable frequency reference to which the frequency of a variable frequency oscillator, such as a voltage controlled oscillator (VCO) can be electronically locked. The high stability and relative insensitivity to environmental perturbations associated with an atomic reference frequency is transferred to the variable frequency oscillator.

Hydrogen, cesium and rubidium frequency standards have been used to provide atomic controlled oscillators in which the generated standard frequency is usually 5 megahertz (MHz) or 10 MHz. Such frequency standards have usually employed a quartz crystal oscillator controlled by a physics package and associated electronics in an effort to maintain an accurate and stable standard frequency on a long-term basis. The physics package and associated electronics have been used to slave the quartz crystal oscillator to the frequency of the atomic transition thereby reducing the tendency of the quartz crystal to exhibit drifting due to aging and environmental effects.

Such atomic frequency standards have in the past generally been characterized by means to dissociate the atoms, and means to form the dissociated atoms into narrow beams of atoms with a specific energy level with said beams being contained within vacuum systems to remove gasses that might interfere with the beam of atoms. Various electrical and thermal components have been associated with the dissociator and the means to provide the atomic beam. While these various components and elements of the prior atomic frequency standards have been necessary to the operation of the frequency standard, they have introduced long-term and short-term instabilities into the frequency standard. Dissociators, vacuum pumps, beam focusing and atomic separation means and other such components contribute sources of unreliability and increase the size and the weight and the power requirements of atomic frequency standards.

The life of commercial cesium atomic beam frequency standards is limited in part from the use of state selection magnets. Because the atomic state selection is velocity dependent, the magnetic beam optics select a relatively narrow velocity distribution of atoms, around 10 percent of the available velocity distribution. In addition, magnetic state selection works by rejection of unwanted atomic states and accepts only one of sixteen states. Thus, the useful atomic flux is less than 1 percent of the total atomic flux. Consequently, a larger cesium consumption is required for a given clock stability than if all of the atoms were used, contributing to beam tube failure in some cases.

In the microwave interaction region of the standard, the magnetic field (called the "C-field") must be uniform, parallel to the magnetic vector of the microwave field, and stable in time. Failure to make a completely smooth transition from the high field regions of the state selection magnets to the C-field region can produce Majorana transitions which can produce large frequency shifts.

Another limitation to existing cesium beam standards occurs because the velocity distributions of magnetic field dependent transitions ($mf=\pm1$) which are adjacent to the clock transition are not symmetrical. This situation, coupled with the detailed lineshape of the Rabi transitions derived from the narrow velocity distribution, produces frequency shifts at lower values of C-field. These shifts contribute to the long term instability of the cesium standard. Increasing the C-field magnitude reduces this effect, but the permissible C-field magnitude is limited by magnetic field instabilities. Operation at certain special C-field values may also reduce the effect.

To avoid these problems, workers in the field have experimented with optical pumping of a beam of atomic cesium and optical state selection to replace state selection magnets. A laboratory cesium beam frequency standard using laser diode optical pumping was reported in 1980, and with further development twenty percent atomatic utilization was reported in 1983 from the use of a single pump frequency derived from a commercially available laser diode. By using two laser diode pumps simultaneously, the atomic utilization was reported to have been increased to forty percent and then nearly one hundred percent. In addition, a three-fold stability improvement in commercial cesium beam standards was reported to result from the replacement of magnetic state selection with optical pumping and fluorescence detection.

There have been other efforts in the art to develop reliable atomic frequency standards having short-term and long-term stability in their frequency output, and such improved reliability and reduced size, weight and power requirements as to permit their economical use and transportation. The long and continuous effort to develop improved frequency standards is exemplified by U.S. Pat. Nos. 3,397,310, 3,403,349, 3,536,993, 3,577,069, 3,718,868, 3,967,115, 4,059,813, 4,354,108, 3,442,658, 4,596,962, 4,684,900, 4,814,728, 4,454,482, 4,425,653, 4,323,860, 4,315,224, 3,670,171, 3,667,066, 3,513,381, 3,495,161 and 435,369. Many of these, such as U. S. Pat. Nos. 3,667,666 and 3,670,171, show a Ramsey microwave resonance cavity, which is a preferred cavity for producing resonances, but which, up to now, has always included two widely separated arms, which has caused standards using such cavities to be relatively large. One patent, U.S. Pat. No. 4,684,900, discloses the use of a laser tuned to the $F=4\pm F'=5$ transition, but only as a detection laser, and not as an optically pumping laser. None of the systems of the prior art employ a dielectrically loaded $TE_{011}$ resonance cavity in a cesium beam frequency standard.

As set forth above, while the concept and benefits of an optically pumped cesium beam frequency standard have been demonstrated in the laboratory, a practical commercial cesium beam standard has not yet been developed.

DISCLOSURE OF THE INVENTION

This invention provides a new compact magnetic resonance spectrometer that can be used to provide a miniaturized frequency standard and a new substantially improved cesium beam frequency standard.

A preferred frequency standard of this invention is based on a cesium resonance detection system using newly discovered anomalous resonance features for a narrow cesium resonance, and novel resonator and optical pumping systems. The features of this new, small, accurate and stable time standard include a dielectrically loaded $TE_{011}$ Ramsey resonance cavity operating at cesium beam frequencies, and most advantageously with $F=4\pm5$ transitions, which allows a single laser light source to be used for both optical pumping and high efficiency optical detection.

BEST MODE FOR CARRYING OUT THE INVENTION

This invention provides a compact resonance system, FIGS. 1 through 7, which employs a dielectrically loaded $TE_{011}$ cesium resonance cavity that contributes significantly to the compactness.

Figure 1:
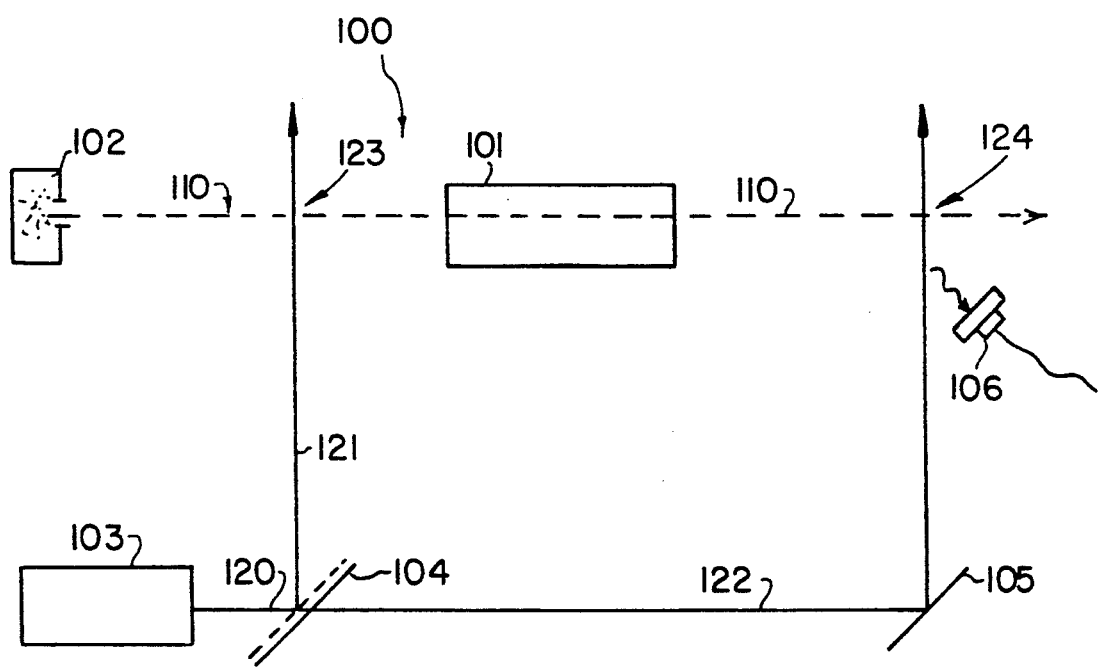
FIG. 1 is a simplified diagram to illustrate the system and method of the invention.

FIG. 1 is a simplified diagram to illustrate the invention. The basic system 100 of FIG. 1 comprises a microwave cavity 101, means 102 for creating a beam of cesium atoms 110 through the microwave cavity 101, means 103 for providing a beam 120 of laser light at a desired frequency, means 104 for splitting the beam of laser light into two laser light beam portions 121, 122 and to direct one of the laser light beam portions 121 to intersect the beam of cesium atoms 110 before entering the microwave cavity 101, means 105 for directing the second of the laser light beam portions 122 to intersect the beam of cesium atom 110 after it leaves the microwave cavity 101, and means 106 for detecting the light emitted from the cesium atom beam 110 in response to the second laser light beam portion 122. The vacuum housing for the cesium atom beam source 103 and microwave cavity 101, and other parts, have been omitted from FIG. 1 to simplify the basic description of the invention.

Figure 2:
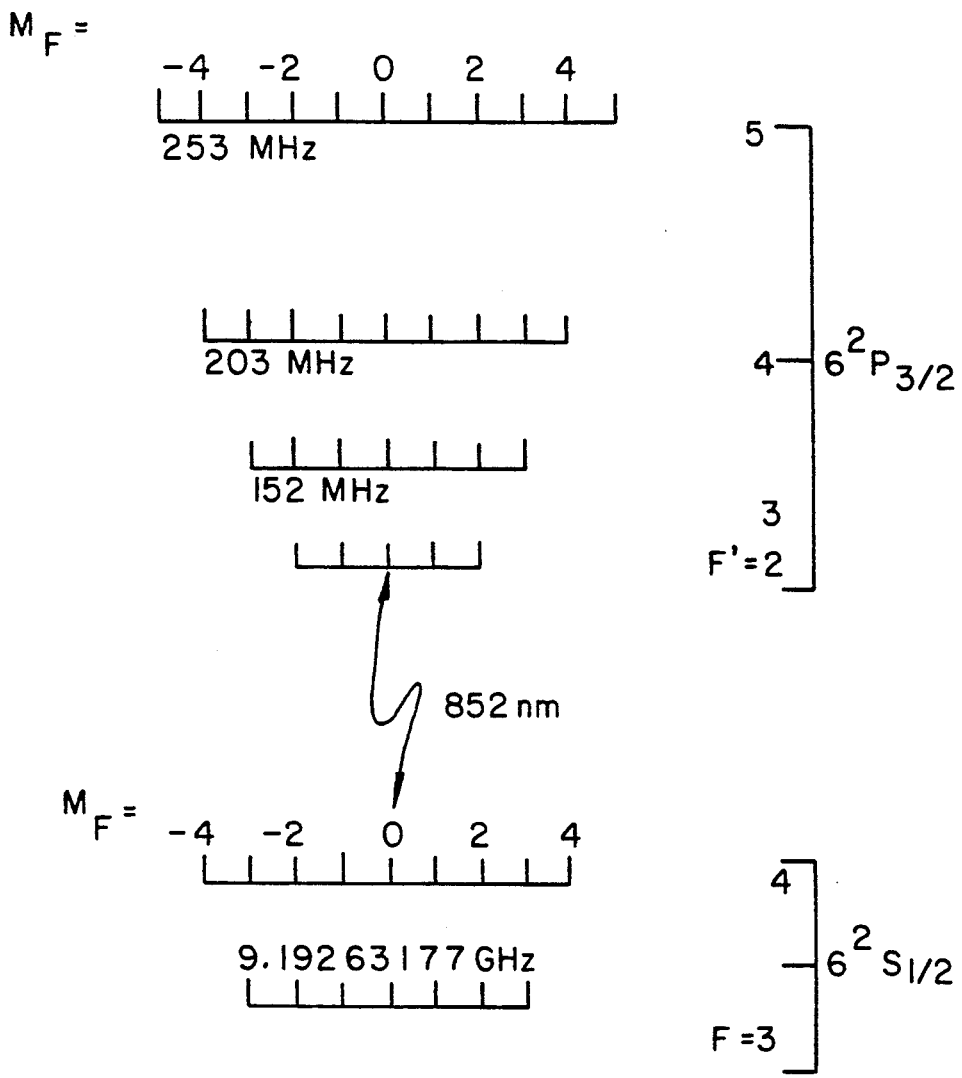
FIG. 2 is an energy level diagram showing the energy levels and transitions that may be employed in the operation of the system of FIG. 1.

In the invention, the source of laser light 103 is timed to provide optical pumping of cesium atoms and cycling at a narrow microwave frequency. FIG. 2 shows the energy level diagram for $^{133}Cs$. In the invention, $F=4\rightarrow5$ cycling is preferred because this allows one source of laser light 103 to be used for both state preparation and state detection of the cesium atom beam 110. Referring again to FIG. 1, cesium atom beam portion 121 is provided with circular polarization by means not shown in FIG. 1 and optically pumps the cesium atoms to provide $F=4\rightarrow F=5$ transition in pumping region 123.

Microwave cavity 101 is preferably a dielectrically loaded $TE_{011}$ resonator with two Ramsey regions in different parts of the same cavity. The dielectric loading of the microwave cavity reduces its diameter and using two Ramsey regions in the same cavity simplifies its construction and reduces the need for coupling two separate resonators. The invention includes use of my discovery of anomalous resonance features in the microwave spectrum associated with non-uniform magnetic fields and changing magnetic field directions that are unexplained but may be used to produce very narrow microwave resonance in the frequency standard.

The microwave cavity 101 is positioned off of the axis of the cesium atom beam 110 and its magnetic field direction so the cesium atoms pass through a transverse microwave r.f. field which is parallel to the static magnetic field. The microwave r.f. field decreases in magnitude from the entrance to zero in the center of microwave cavity 101 and then increases in magnitude of the opposite direction as the cesium atoms exit the pumping of microwave cavity to produce a Ramsey interference pattern. The degree of offset of microwave cavity 101 from the axis of the cesium atom beam 110 effects the anomalous resonance features described above to provide a narrow microwave resonance in the microwave cavity 101.

Upon exiting the microwave cavity, the cesium atom beam 110 is excited by laser beam portion 122, which remains linearly polarized, in a $F=4$ to $F'=5$ transition in a detection region 124 and the resulting fluorescence is detected by the detector 106. The signal output of detector 106 was used to lock a 5 MHz quartz oscillator to the narrow cesium microwave transition with an electronics package, including circuitry well known to those skilled in the art.

Figure 3:
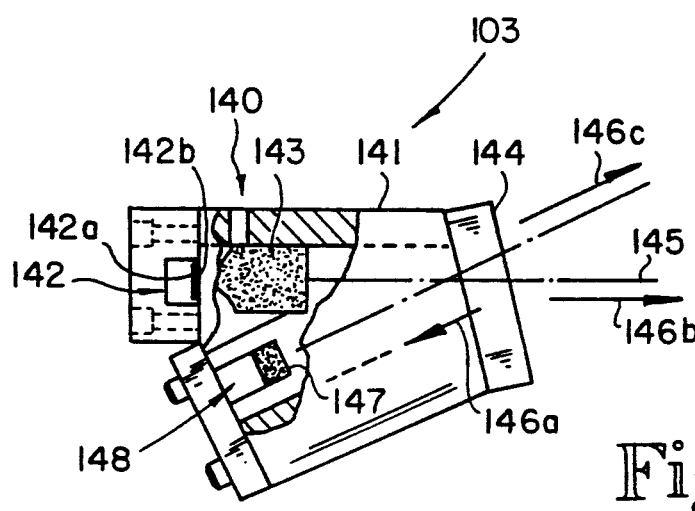
FIG. 3 is a partially cut-away drawing of a preferred laser usable with this invention.

A preferred means 103 laser is shown in greater detail in FIG. 3 as a laser assembly 140, which uses a folded Littrow configuration of external cavity. Laser assembly 140 is adapted to transmit through the system a substantially unvarying beam of laser light at a frequency corresponding to the desired optical frequency, preferably to provide $F=4$ to $F=5$ transitions of a narrow velocity class of cesium atoms.

The laser assembly 140 comprises a laser cavity forming means 141 including a laser diode 142 having a non-transmitting back surface 142a provided with a gold coating and a transmitting surface 142b provided with an anti-reflective coating.

A lens 143 produces the laser beam from the laser light emitted through the transmitting surface 142b of the laser diode 142.

A partial reflector 144 is arranged at an angle to the central axis 145 of the beam of light from lens 143 so that a first portion of the beam of light 146a is reflected at an angle generally toward a diffraction grating 147 and the remaining portion of the beam of light 146b is transmitted through the partial reflector, generally parallel to the central axis of the beam of light from said lens.

A diffraction grating 147 is supported to receive the first portion 146a of the beam and to reflect light at the frequency corresponding to the desired optical frequency of the cesium atoms back to said partial reflector 144 and into laser diode 142. A portion 146c of the first portion passes through the partial reflector 144 and is used to provide laser light beam 120.

A piezoelectric transducer 148 supports diffraction grating 147 and provides adjustment of the effective length of the laser cavity.

In this folded Littrow design, a commercially manufactured laser diode can be modified by gold coating the back facet and placing an anti-reflection (AR) coating on the front facet. Light emitted by the laser is collimated, passes to a partially reflective output mirror and reflected to a 1200 1/mm diffraction grating. Light at the proper wavelength is reflected back on itself to the laser diode, producing a second output beam in the process. The angle of the diffraction grating with respect to the laser beam axis determines the coarse wavelength of the laser, and successfully discriminates against unwanted longitudinal laser modes associated with the laser chip (free spectral range, FSR=150 GHz). A piezoelectric transducer (PZT) can provide control of the external cavity length, which allows tuning over the FSR of 2.5 GHz. Additional fine tuning and rapid frequency modulation of the laser is possible through modulation of the laser injection current.

Measurements with a 0.5m monochromator demonstrate that the output from this device can be highly single mode, with no evidence of other longitudinal cavity modes to $-38.7$ dBc. By beating the outputs of two such lasers, it has been determine that the 3-dB linewidth of the pair is about 1 MHz, which is favorable compared with the 5-MHz natural linewidth of the cesium D2 optical resonance.

When such a laser is used to detect cesium atoms in an atomic beam, the measured SNR was $1.8 \times 10^{10}$/Hz. This value of SNR is satisfactory for miniature cesium standard designs.

Figure 4:
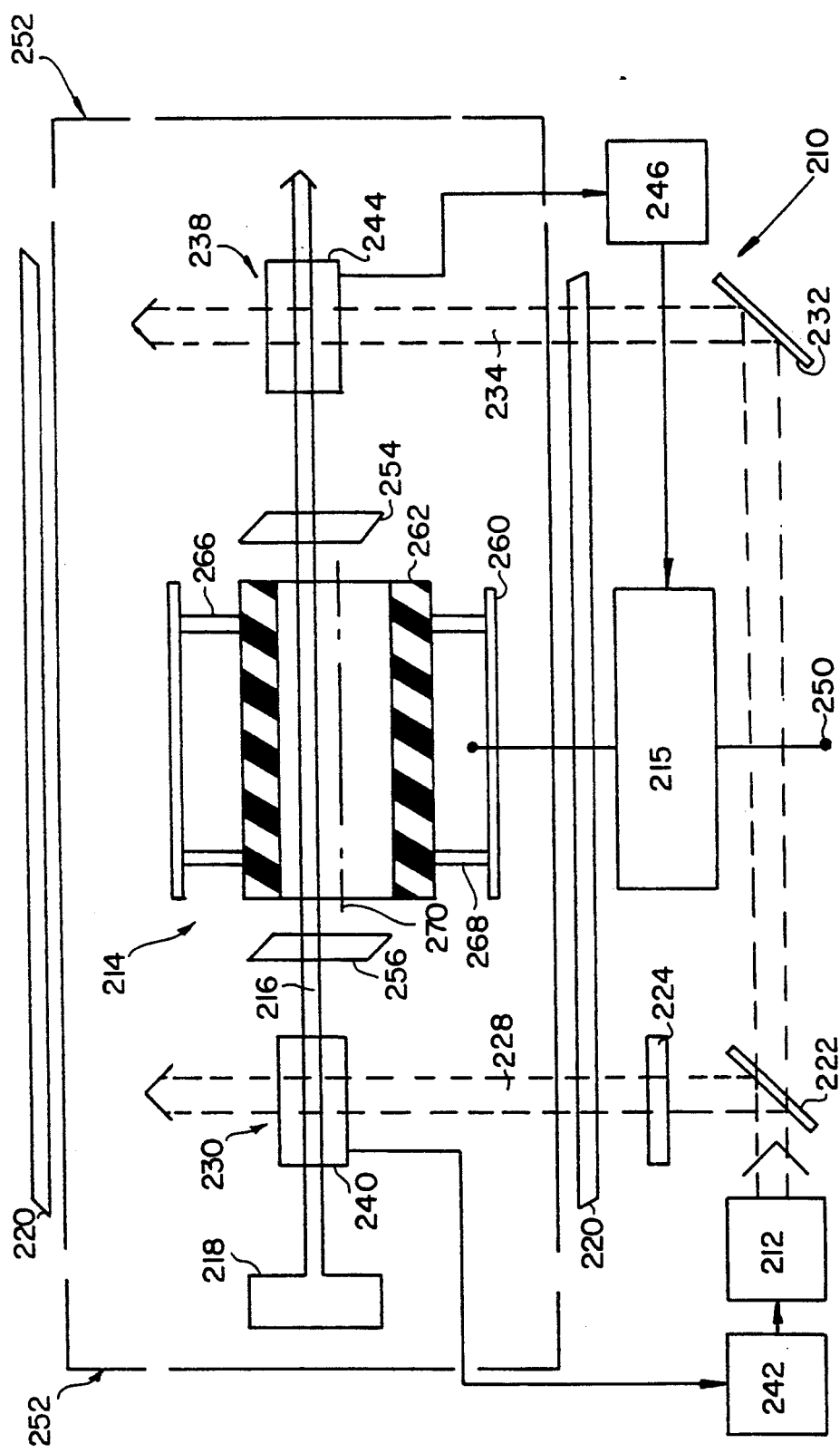
FIG. 4 is a diagrammatic illustration of a preferred embodiment of a frequency standard system and method of invention.

Turning now to FIG. 4, a preferred embodiment of a compact frequency standard 210 according to the invention is shown. This embodiment uses a single compact diode laser source 212, like the laser source of FIG. 3, and a dielectrically loaded $TE_{011}$ microwave cavity 214, which is driven by frequency generator 215. However, microwave cavity 214 is an open ended cavity through which a cesium beam 216 passes. Cesium beam 216 is generated by cesium source 218, preferably a cesium oven. A wire coil 220 provides a static transverse magnetic field B. The diode laser source 212 is preferably tuned to the $F=4 \rightarrow 5$ "cycling" transition. A partially transmitive, partially reflective element 222 directs a portion of the laser light through a ¼ wave plate 224, which converts the radiation to circularly polarized radiation oriented in the direction of the magnetic field B, to form a circularly polarized beam 228 which intersects the cesium beam 216 at right angles in upstream optical pumping interaction region 230. The rest of the laser light passes through element 222 and is directed by mirror 232 to form a linearly polarized beam 234 which intersects the cesium beam 216 at a downstream detection region 238. The use of the cycling transition and the ¼ wave plate enables the system to use a single laser for both optical pumping and detection. An upstream photodetector 240 is located at the upstream pumping interaction region 230 and is connected to a laser lock circuit 242 which locks the diode laser source 212 to the desired frequency. A downstream photodetector 244 is located at the downstream detection region 238 and is connected to frequency generator 215, thus forming a feedback loop to lock the frequency generator 215 to the desired frequency. The frequency generator 215 also includes an output terminal 250 which carries the frequency standard signal. Cesium source 218, beam 216, detectors 240 and 244, and microwave cavity 214 are contained within a vacuum housing 252. The system also includes an optional set of coils 254 and 256 which may be added to produce inhomogeneities in the static field B as will be discussed further below.

Microwave cavity 214 is a novel miniature Ramsey cavity. In the preferred embodiment, the cavity includes a cylinder 260, preferably made of copper and having an inner diameter of 2.69 cm and a length of 3.0 cm, and a dielectric cylinder 262, preferably made of alumina and having an outside diameter of 1.91 cm and a length of 3.0 cm. The alumina cylinder 262 is preferably mounted within the copper cylinder 260 using thin teflon spacers 266 and 268. This produces a dielectrically loaded $TE_{011}$ resonator. The laser 212 is a laser diode, preferably as shown in FIG. 3. Each of the photodetectors 240 and 244 comprise a pair of photodiodes, one above and one below the plane of the paper in FIG. 4, connected in parallel, as is known in the art. The cesium oven 218, the coils 220, the vacuum chamber 252, ¼ wave plate 224, element 222, mirror 232, the lock circuits 242 and 246, and the frequency generator 248 are all parts that are known in the art that can be made or purchased from the general descriptions given.

The microwave cavity 214 is located with its axis 270 parallel to but displaced from the axis of the cesium beam 216 in the plane defined by the cesium beam 216 and the magnetic field B. Thus, the cesium atoms pass through a transverse microwave r.f. field which is parallel to the static magnetic field B. The magnitude of the r.f. field decreases to zero in the cavity center and then increases in magnitude with opposite sign as the atoms exit the cavity 214. Microwave cavity 214 thus operates like a Ramsey cavity, but one in which the two Ramsey regions are different parts of the same cavity. Thus, the invention provides a small Ramsey resonator that is useful in producing a miniaturized frequency standard. A Ramsey resonator that uses two regions of the same resonator for the Ramsey pair simplifies construction and eliminates the need for coupling between the two separate resonators.

Figure 5:
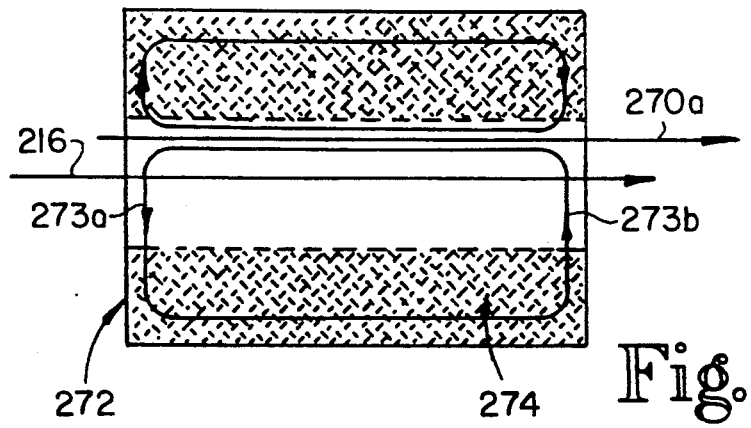
FIG. 5 is an alternative embodiment of a microwave resonator for the system of FIG. 4.
Figure 6:
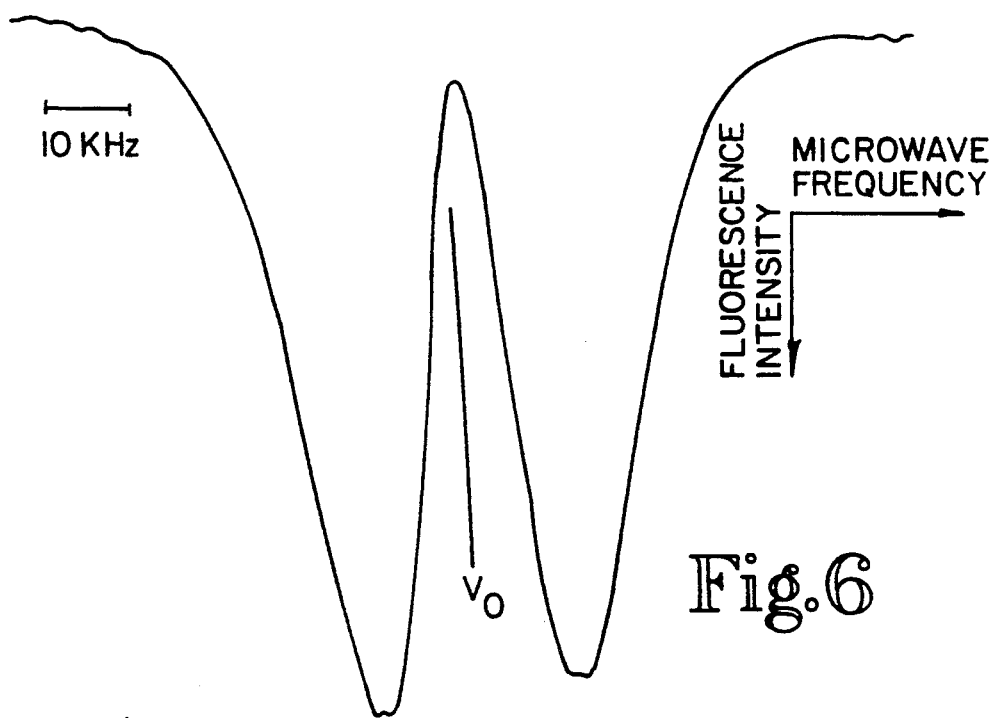
FIG. 6 shows the output of the downstream photodetector, for the embodiment of FIG. 5; and, FIG. 7 is a graph of the output of a phase sensitive detector connected to the downstream photodetector of the system of FIG. 4 showing typical narrow features of the spectrum produced by the system of the invention.

An alternative embodiment of a small Ramsey cavity 272 is shown in part in FIG. 5. This cavity is the same as the cavity 214 of FIG. 4 except that the dielectric 274 has a varying wall thickness. This causes the effective electrical axis of the resonator to be displaced from the geometric axis of the cavity. Thus, the cavity can be placed coaxially with the cesium beam 216 and the beam will still travel a line which crosses transverse r.f. fields 273a and 273b at the entrance and exit of the cavity, with the phase of the r.f. fields reversing while passing from the entrance to the exit. The output of the downstream photodetector 244 with such a cavity is shown in FIG. 6. Note the large asymmetry about line center and the presence of two peaks. This is a typical inverted Ramsey pattern with a line width of about 11 kHz.

The short term stability measured with the frequency standard according to the invention was less than $5\times10^{-10} \tau^{-\frac{1}{2}}$. With a longer microwave interaction, such as with a $TE_{013}$ cavity, the demonstrated signal-to-noise, and a full-size cesium oven, the projected stability based on this measurement becomes less than $2\times10^{-12} \tau^{-1/2}$.

Figure 7:
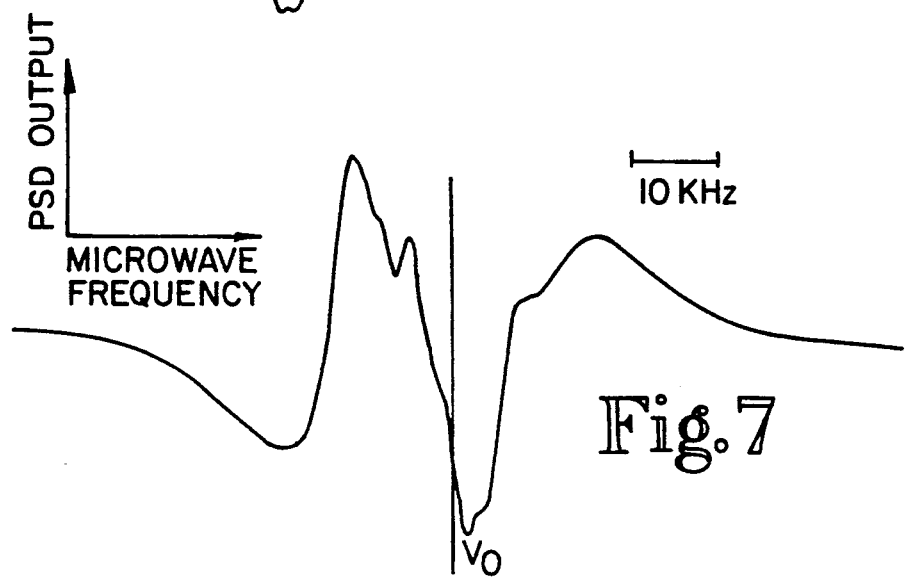

FIG. 7 shows a typical output of the downstream photodetector 244 as measured by a phase sensitive detector in the frequency lock circuitry 246 when inhomogeneity is added to the fields in the Ramsey resonator 272 by use of coils 254 and 256. Very narrow features are evident in this spectrum. The narrowest features are only 1.5 kHz wide which corresponds to a Ramsey interaction length of about 10 cm. The asymmetry corresponds to a frequency shift of a few parts in $10^7$ at line center. I have discovered that these anomalous resonance features appear in the microwave spectrum associated with non-uniform static magnetic field direction and changing microwave magnetic field direction. Such narrow resonance features may result in more accurate frequency standards with better signal-to-noise, or more compact standards at the same or better accuracy and signal-to-noise. That is, from the example given above, an accuracy associated with a Ramsey cavity of 10 cm in length can be obtained in a cavity of only 3 cm in length.

A feature of the invention is the use of the novel pumping scheme discussed above, that is, the successful pumping of the cesium atoms using the $F=4\rightarrow F'=5$ transition. The energy levels for this transition are shown in FIG. 2. As indicated above, a static magnetic field was applied along the direction of the pump laser beam, and the laser light was circularly polarized. In this manner, the atoms in the $F=4$, $m_F=0$ ground state hyperfine level were pumped into either the $F=4$, $m_F=+4$ or $F=4$, $m_F=-4$ sublevels, depending on the sign of the circular polarization. In the microwave cavities 214 or 272, the atoms in the $F=3$, $m_F=0$ ground state level are converted to the $F=4$, $m_F=0$ ground state level, while in the downstream detection region, the linear polarized light is repeatedly absorbed by atoms in the $F=4$ levels, emitting fluorescent light which is detected by detector 244. Thus, atoms which make the $m_F=0\rightarrow 0$ transition while the beam passes through microwave cavity 214 or 272 then contribute to increased fluorescence in the downstream detection region 238.

The great advantage in this method is that the same laser can be used for optical pumping upstream as is used for fluorescence detection on a cycling transition downstream. However, atoms are also removed from the $F=4$, $m_F=0$ sublevel, as compared with the conventional pumping method, which adds atoms to the $F=3$, $m=0$ sublevel. In addition, the atoms in the $F=4$, $m_F\pm 4$ sublevels can contribute to background fluorescence in the detection region, which can increase noise. This latter problem may be removed by applying a relatively large magnetic field in the detection region, which shifts the $m_F\pm 4$ sublevels out of the laser line width.

When the $F=4\rightarrow F'=5$ transition is used for optical pumping, the absolute value of the microwave clock transition is less than $(\pm 12.1 \pm 3.5)\times 10^{-10}$. Scaling this limit by the size of the fluorescence present when the $F=4\rightarrow F'=4$ transition is used for optical pumping, and accounting for the different light shift coefficients of the two optical transitions, the light shift limit is seen to be less than $2\times 10^{-10}$. With a 10% stability of fluorescence, the maximum instability due to light shift is therefore $\pm 2\times 10^{-11}$. On theoretical grounds, it is expected that the light shift is actually much less.

The invention thus provides a new frequency standard 21 comprising: a source of atoms 102, 218, preferably cesium atoms; a novel resonance system 101, 214 that operates with $TE_{011}$ microwave resonance, that includes a dielectric means 262 for loading the cavity so that interaction between the atoms and electromagnetic energy in the cavity is more effective, that has first and second Ramsey regions that are contiguous within the cavity and that further comprises means 254, 256 for causing a resonance anomaly; a cesium state selection means that includes a laser source 140, 212 and that provides $F=4\rightarrow F'=5$ transitions, that uses a single laser source 103, 212 to provide both optical pumping and detection; frequency generator 215 for driving the resonance system 214 and detection and frequency locking means 106, 244, 246 for locking the frequency standard to an atomic microwave transition frequency and further including the other features shown and described and claimed below.

While I have described what I believe to be the most preferred present embodiments, my invention can take many forms. Accordingly, it should be understood that the invention is to be limited only insofar as required by the following claims and the prior art.

I claim:

1. A frequency standard comprising:
  a source of cesium atoms;
  $TE_{011}$ microwave resonance cavity means for altering the state of said atoms;
  cesium state select means for causing cesium atoms in a selected energy state to interact with the microwave resonance in said cavity means;
  dielectric means within said resonance cavity means for altering the electromagnetic characteristics of said cavity means so that the interaction between said cesium atoms and the microwave energy in said cavity means is more effective;
  frequency generator means for generating a frequency for driving said microwave resonance cavity means;
  detector means for detecting fluorescence from said cesium atoms and for producing a signal representative of the amount of cesium atoms that have had their state altered by said microwave resonance cavity means; and
  lock means responsive to said detecting means signal for locking said frequency generator means to a frequency characteristic of said cesium atoms.

2. A frequency standard as in claim 1 wherein said cesium state select means comprises a laser assembly suitable for use in a miniaturized frequency standard, said laser assembly comprising:
  a laser diode having a non-transmitting surface provided with a gold coating and a transmitting surface provided with an anti-reflective coating;
  lens for focusing the light emitted through said transmitting surface into a beam traveling along a beam axis;
  a partial reflector arranged at an angle to said beam axis so that a first portion of the beam is reflected at an angle along a second axis and the remaining portion of the beam is transmitted through the partial reflector;
  a diffraction grating supported to receive said first portion of said beam and reflect it back toward said partial reflector in a direction parallel to said second axis; and a piezoelectric transducer for supporting said diffraction grating and moving it in a direction along said second axis of said first portion of said beam.

3. A frequency standard as in claim 2 wherein said partial reflector is an 80% partial reflector and said diffraction grating is a 1200 line/mm diffraction grating.

4. A frequency standard as in claim 1 wherein said cesium state select means comprises a source of iation of a frequency that will cause $F=4 \rightarrow F'=5$ transitions in cesium atoms.

5. A frequency standard as in claim 1 wherein said cesium state select means further includes a means for creating a static magnetic field.

6. A frequency standard as in claim 1 wherein said microwave resonance cavity means is a Ramsey cavity.

7. A frequency standard as in claim 1 wherein said dielectric means comprises means for assisting detection of a resonance anomaly in the cesium radiation spectrum, which resonance anomaly has a line width of less than 10 kHz.

8. A frequency standard as in claim 1 wherein said dielectric means comprises alumina.

9. A frequency standard comprising:
a source of a beam of atoms;
dielectrically loaded Ramsey microwave resonance cavity means for altering the state of said atoms, said cavity means having a first Ramsey region in which said beam of cesium atoms travels a line that crosses an r.f. magnetic field transverse to the beam and a second Ramsey region in which said beam of atoms crosses an r.f. magnetic field transverse to said beam and opposite in phase to the magnetic field in said first Ramsey region, said first and second Ramsey regions being contiguous parts of the same cavity;
state select means for causing atoms in a selected energy state to interact with the microwave resonance in said cavity means;
frequency generator means for generating a frequency for driving said Ramsey microwave resonance cavity means;
detector means for detecting fluorescence from said atoms and for producing a signal representative of the amount of atoms that have had their state altered by said Ramsey microwave resonance cavity means; and
lock means responsive to said detecting means signal for locking said frequency generator means to a frequency characteristic of said atoms.

10. A frequency standard as in claim 9 further including dielectric means within said Ramsey resonance cavity means for altering the magnetic field in said cavity means to create said Ramsey regions.

11. A frequency standard as in claim 10 wherein said dielectric means further includes means for altering the electromagnetic characteristics of said cavity means so that said cavity means is physically smaller.

12. A frequency standard as in claim 10 wherein said Ramsey microwave resonance means further comprises means for causing a resonance anomaly in the radiation spectrum of said atoms, which resonance anomaly has a line width of less than 10 kHz.

13. A frequency standard as in claim 9 wherein said Ramsey microwave resonance cavity means is a $TE_{011}$ cavity.

14. A frequency standard as in claim 9 wherein said Ramsey microwave resonance cavity means is a dielectrically loaded $TE_{013}$ cavity.

15. A frequency standard as in claim 9 wherein said atoms are cesium atoms.

16. A frequency standard as in claim 15 wherein said state select means comprises a source of radiation of a frequency that will cause $F=4 \rightarrow F'=5$ transitions in cesium atoms.

17. A frequency standard as in claim 9 wherein said Ramsey resonance cavity means comprises a cavity that is symmetric about an axis and said beam of atoms passes through said cavity along a line parallel to and displaced from said axis.

18. A frequency standard comprising:
a source of a beam of atoms;
anomaly means for causing a resonance anomaly in the radiation spectrum of said atoms, which resonance anomaly has a line width of less than 10 kHz;
$TE_{013}$ microwave resonance cavity means for altering the state of said atoms;
state select means for causing atoms in a selected energy state to interact with the microwave resonance in said cavity means;
frequency generator means for generating a frequency for driving microwave resonance cavity means;
detector means for detecting fluorescence from said atoms and for producing a signal representative of the amount of atoms that have had their state altered by said microwave resonance cavity means; and
lock means responsive to said detecting means signal for locking said frequency generator means to the frequency of said resonance anomaly.

19. A frequency standard as in claim 18 wherein said anomaly means comprises non-uniform magnetic means for causing a non-uniform static magnetic field in said cavity means.

20. A frequency standard as in claim 19 wherein said non-uniform magnetic means comprises a hollow dielectric cylinder in said cavity means, said cylinder having a varying wall thickness.

21. A frequency standard as in claim 19 wherein said cavity means comprises a cavity that is symmetric about an axis and said non-uniform magnetic means comprises said cavity axis being displaced from the axis of said beam of atoms.

22. A frequency standard as in claim 19 wherein said non-uniform magnetic means comprises at least one coil means.

23. A frequency standard as in claim 22 wherein said non-uniform magnetic means comprises a first coil means for producing a uniform static magnetic field and a second coil means for causing inhomogeneities in said static magnetic field.

24. A frequency standard as in claim 18 wherein said atoms are cesium atoms and said anomaly is an anomaly in the cesium radiation spectrum.

25. A frequency standard as in claim 24 wherein said state select means comprises a source of radiation that will cause $F=4 \rightarrow F'=5$ transitions in cesium atoms.

26. An optically pumped frequency standard comprising:
a source of cesium atoms;
$TE_{011}$ or $TE_{013}$ microwave resonance cavity means for altering the state of said atoms;

optical pump means for causing cesium atoms in a selected energy state to interact with the microwave resonance in said cavity means, said optical pump means comprising a source of radiation of a frequency that will cause $F=4 \rightarrow F'=5$ transitions in cesium atoms;

frequency generator means for generating a frequency for driving said microwave resonance cavity means;

detector means for detecting fluorescence from said cesium atoms and for producing a signal representative of the amount of cesium atoms that have had their state altered by said microwave resonance cavity means; and lock means responsive to said detecting means signal for locking said frequency generator means to a frequency characteristic of said cesium atoms.

27. A frequency standard as in claim 26 wherein said optical pump means comprises a laser.

28. A frequency standard as in claim 27 wherein said laser comprises a laser diode.

29. A frequency standard as in claim 27 wherein said detector means comprises detector radiation means for directing light from said laser to interact with cesium atoms that have interacted with said resonance cavity means.

30. A frequency standard as in claim 29 wherein said optical pump means comprises means for circularly polarizing said radiation, and said detector radiation means comprises means for directing linearly polarized light from said laser to interact with said cesium atoms.

31. A frequency standard as in claim 26 wherein said optical pump means comprises magnetic means for creating a static magnetic field and polarization means for circularly polarizing said radiation in a direction parallel to said magnetic field.

32. A method of using radiation at a frequency that causes $F=4 \rightarrow F'=5$ transitions in cesium atoms in a detection system, said method comprising the steps of:

providing: a static magnetic field, a beam of cesium atoms transverse to the direction of said static magnetic field; and radiation at said frequency circularly polarized in a direction parallel to said magnetic field; .

transmitting said circularly polarized radiation through said beam of cesium atoms along a direction parallel to said magnetic field direction;

passing said beam of cesium atoms through a dielectrically loaded $TE_{011}$ or $TE_{013}$ microwave resonance cavity; and detecting the intensity of the fluorescence of atoms which have made the $m_F=0 \rightarrow 0$ transition in the microwave resonance cavity.

33. The method of claim 32 wherein said step of detecting comprises the steps of providing linearly polarized radiation at said frequency, and directing said linearly polarized radiation on said beam of atoms in a direction along said magnetic field after the beam has passed through said microwave cavity.

34. The method of claim 33 wherein said step of transmitting comprises providing a laser that produces linearly polarized radiation at said frequency and passing said linearly polarized radiation through a ¼ wave plate to circularly polarize it.

35. The method of claim 34 wherein said step of directing comprises directing radiation from said laser on said beam of atoms.

* * * * *